(12) United States Patent
Hwang et al.

(10) Patent No.: US 7,370,262 B2
(45) Date of Patent: May 6, 2008

(54) APPARATUS AND METHOD GENERATING ERROR FLAG FOR ERROR CORRECTION

(75) Inventors: Sung-hee Hwang, Seoul (KR);
Hyun-jeong Park, Gyeonggi-do (KR);
Joo-seon Kim, Gyeonggi-do (KR);
Sang-hyun Ryu, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 443 days.

(21) Appl. No.: 10/766,907

(22) Filed: Jan. 30, 2004

(65) Prior Publication Data

US 2004/0187065 A1 Sep. 23, 2004

(30) Foreign Application Priority Data

Feb. 25, 2003 (KR) .................. 10-2003-0011637

(51) Int. Cl.
*H03M 13/00* (2006.01)
(52) U.S. Cl. .................. 714/775; 714/762; 714/789
(58) Field of Classification Search ............... 714/775, 714/755, 21, 763, 762, 765, 766, 789, 788
See application file for complete search history.

(56) References Cited

U.S. PATENT DOCUMENTS 5,485,572 A * 1/1996 Overley .................. 714/21
5,696,774 A * 12/1997 Inoue et al. ............... 714/755
5,757,824 A * 5/1998 Arai et al. ................. 714/755
6,216,247 B1 * 4/2001 Creta et al. ............... 714/763

(Continued)

FOREIGN PATENT DOCUMENTS

JP  2002-074664  3/2002

(Continued)

OTHER PUBLICATIONS

Office Action issued in Japanese Patent Application No. 2004-44160 on Mar. 14, 2006.

(Continued)

*Primary Examiner*—Guy Lamarre
*Assistant Examiner*—Fritz Alphonse
(74) *Attorney, Agent, or Firm*—Stein, McEwen & Bui, LLP

(57) ABSTRACT

An error flag generation apparatus and method for error correction, wherein the apparatus includes: a frame-sync error memory which stores frame-sync error information for each data block; a BIS (Burst Indicator Subcode) error flag memory which stores a BIS error flag for each data block; and an error flag generator, which generates an error flag indicating error existence/absence for ECC (Error-Correction Coding) data with reference to the frame-sync error information stored in the frame-sync error memory and the BIS error flag stored in the BIS error flag memory.

4 Claims, 4 Drawing Sheets

U.S. PATENT DOCUMENTS

| | | |
|---|---|---|
| 6,263,469 B1 | 7/2001 | Jang |
| 6,367,049 B1 | 4/2002 | Van Dijk et al. |
| 6,662,332 B1 * | 12/2003 | Kimmitt .................. 714/762 |
| 6,763,078 B2 * | 7/2004 | Lin et al. .................. 375/354 |
| 6,907,559 B2 | 6/2005 | Hall et al. |
| 6,987,684 B1 * | 1/2006 | Branth et al. ............ 365/49 |
| 2002/0024914 A1 | 2/2002 | Kobayashi |
| 2004/0233812 A1 | 11/2004 | Kobayashi |

FOREIGN PATENT DOCUMENTS

| | | |
|---|---|---|
| JP | 2003-123333 | 4/2003 |
| WO | 99/60706 | 11/1999 |
| WO | WO 02/052560 A1 | 7/2002 |

OTHER PUBLICATIONS

Wim Coene, et al., "Channel Coding And Signal Processing For Optical Recording Systems Beyond DVD", Mar. 2001, vol. 37, No. 2, pp. 682-688, IEEE Transactions On Magnetics.

Tatsuya Narahara, et al. "Optical Disc System For Digital Video Recording", Feb. 2000, vol. 39, Part 1, No. 2B, pp. 912-919, Japanese Journal of Applied Physics.

* cited by examiner

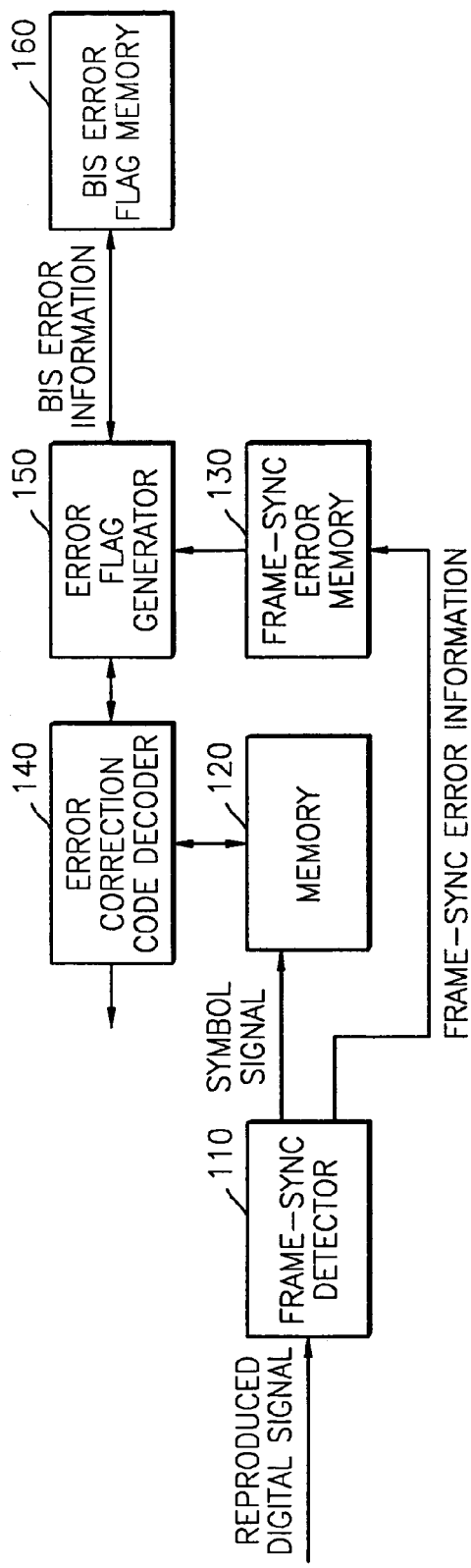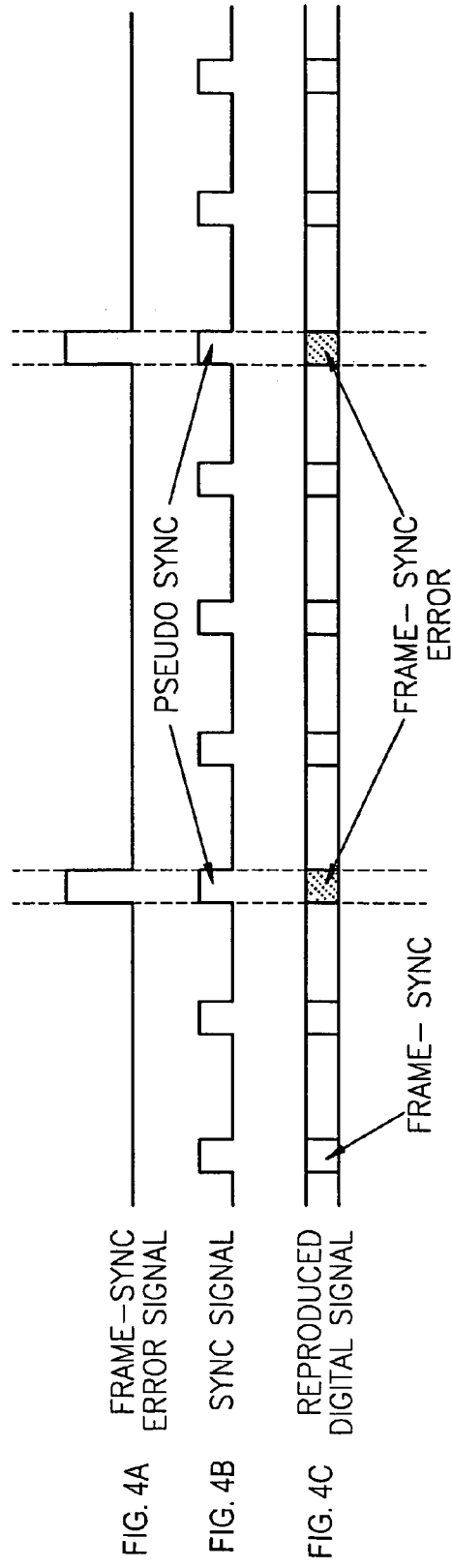
FIG. 3
FIG. 4A  FRAME-SYNC ERROR SIGNAL
FIG. 4B  SYNC SIGNAL
FIG. 4C  REPRODUCED DIGITAL SIGNAL

APPARATUS AND METHOD GENERATING ERROR FLAG FOR ERROR CORRECTION

CROSS-REFERENCE TO RELATED APPLICATIONS

This application claims the benefit of Korean Patent Application No. 2003-11637, filed on Feb. 25, 2003, in the Korean Intellectual Property Office, the disclosure of which is incorporated herein by reference.

BACKGROUND OF THE INVENTION

1. Field of the Invention

The present invention relates to an apparatus and method generating an error flag for error correction.

2. Description of the Related Art

To store information in an optical recording medium such as CD or DVD, error-correction coding (ECC) is performed in which parity data is added to user data to generate a codeword and the codeword is processed according to a predetermined method. If the user data is 30 bytes, the parity data is 30 bytes, and accordingly one codeword is 60 bytes, error correction is possible although errors are generated in maximal 15 bytes of one codeword when decoding is performed. However, if an error flag indicating the location of data including an error in the codeword is provided, error correction is possible although errors are generated in maximal 30 bytes of the codeword.

Such a technique that improves error correction performance using an error flag is called erasure correction. The erasure correction has higher error correction efficiency where a burst error is generated rather than a random error.

U.S. Pat. No. 6,367,049 discloses an error correction format consisting of a plurality of ECC (Error Correction Code) columns and a plurality of BIS (Burst Indicator Subcode) columns. BIS is information that is inserted when decoding is performed, in order to indicate the generation of a burst error. A reliability of a decoded BIS is higher than that of ECC.

FIG. 1 is a view showing a data block with an error correction format disclosed in the above-described U.S. Pat. No. 6,367,049.

According to the error correction format, in one data block, frame synchronization (frame-sync) data is included in the heading of the data block, and subsequently 38 ECC columns and one BIS column are located alternately. One data block has 496 frames. Data constructing the data block is interleaved according to a predetermined method. The detailed descriptions related to the error correction format and interleaving are disclosed in the above-described U.S. patent application Ser. No. 6,367,049.

FIG. 2 shows a detailed structure of one frame forming part of the data block of FIG. 1.

Referring to FIG. 2, in one frame, frame-sync data is included in the heading of the frame and subsequently 38-byte ECC and one-byte BIS are located alternately.

However, an error correction system according to the error correction format shown in FIGS. 1 and 2 has problems in that an interleaving process is complex, accordingly the generation of an error flag for erasure correction is not easy, and a hardware structure is complicated.

SUMMARY OF THE INVENTION

The present invention provides an apparatus and method generating an error flag for error correction, having improved performance and being advantageous in cost.

According to an aspect of the present invention, there is provided an apparatus generating an error flag, the apparatus including: a frame-sync error memory which stores frame-sync error information for each data block; a BIS (Burst Indicator Subcode) error flag memory which stores a BIS error flag for each data block; and an error flag generator, which generates an error flag indicating error existence/absence for ECC (Error-Correction Coding) data with reference to the frame-sync error information stored in the frame-sync error memory and the BIS error flag stored in the BIS error flag memory.

According to another aspect of the present invention, there is provided an error flag generation method comprising: receiving a reproduced digital signal; generating frame-sync error information for each data block using the reproduced digital signal; storing the frame-sync error information in a frame-sync error memory for each data block; generating a BIS error flag of the data block for each data block; storing the BIS error flag of the data block in a BIS error flag memory for each data block; and generating an error flag indicating error existence/absence for ECC data with reference to the frame-sync error information stored in the frame-sync error memory and the BIS error flag stored in the BIS error flag memory.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 3 is a block diagram of an apparatus for generating an error flag, according to an embodiment of the present invention;

FIGS. 4A-4C are timing charts describing the generation of a frame synchronization (frame-sync) error signal;

DETAILED DESCRIPTION OF THE PREFERRED EMBODIMENTS

Figure 1:
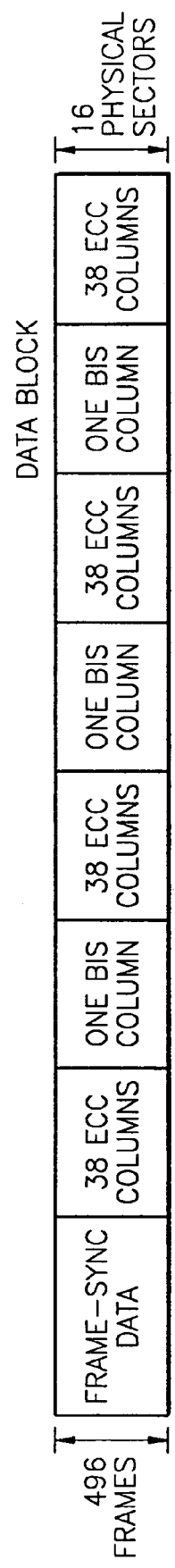
FIG. 1 is a view showing a data block with an error correction format according to a conventional technique.

Reference will now be made in detail to the embodiments of the present invention, examples of which are illustrated in the accompanying drawings, wherein like reference numerals refer to the like elements throughout. The embodiments are described below to explain the present invention by referring to the figures.

FIG. 3 is a block diagram of an apparatus generating an error flag, according to an embodiment of the present invention. Referring to FIG. 3, the error flag generation apparatus includes a frame synchronization (frame-sync) detector 110, a memory 120, a frame synchronization (frame-sync) error memory 130, an error correction code decoder 140, an error flag generation unit 150, and a BIS (Burst Indicator Subcode) error flag memory 160.

The frame-sync detector 110 receives a reproduced digital signal, and outputs frame-sync error information indicating an error existence/absence for frame-sync data of frames forming a data block, to the frame-sync error memory 130. The frame-sync detector 110 also outputs a symbol signal for error correction to the memory 120. The digital signal input to the frame-sync detector 110 is a signal read from information stored in a disk (not shown) using an optical head (not shown), subjected to a high-frequency signal processing and equalizing, and reproduced.

FIGS. 4A-4C are timing charts describing the generation of a frame-sync error signal by the frame-sync detector 110.

The frame-sync detector 110 generates a pseudo sync signal, shown in FIG. 4B coinciding with a frame-sync signal existing in an original digital signal. The frame-sync detector 110 compares the generated pseudo sync signal with a frame-sync signal of the reproduced digital signal, shown in FIG. 4C, and generates a frame-sync error signal, shown in FIG. 4A.

Figure 2:
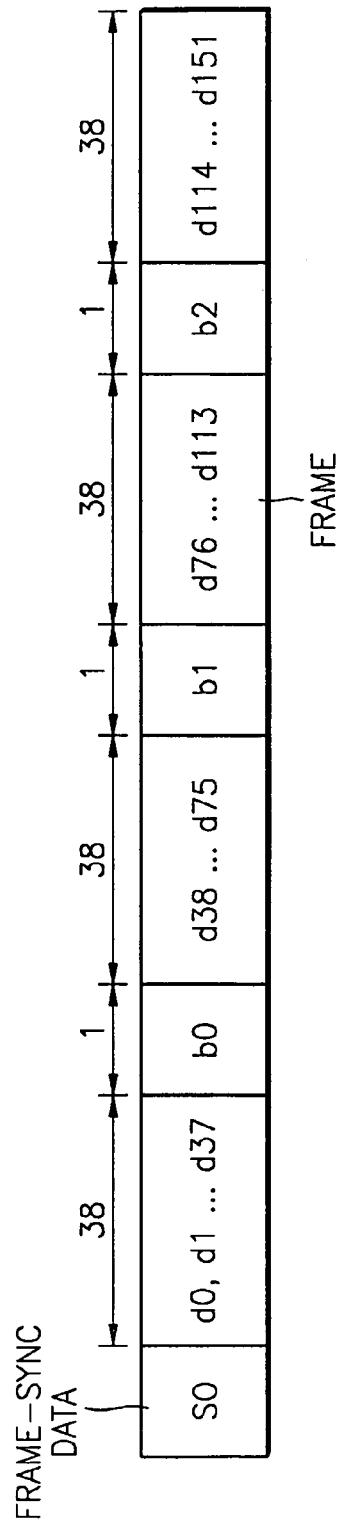
FIG. 2 shows a detailed structure of one frame forming part of the data block of FIG. 1.

The memory 120 receives and stores the symbol signal for error correction transmitted from the frame-sync detector 110. The memory 120 stores the symbol signals with the error correction code format as shown in FIGS. 1 and 2 for each data block.

The frame-sync error memory 130 receives and stores the frame-sync error information transmitted from the frame-sync detector 110.

Figure 5:
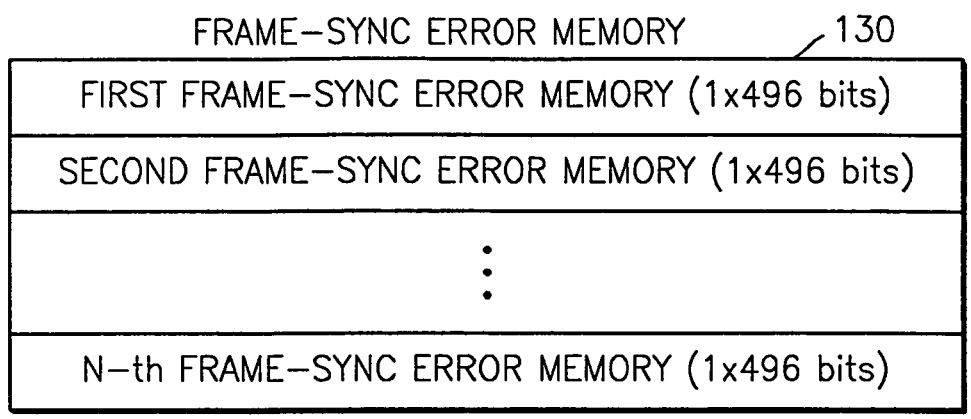
FIG. 5 is a view showing a structure of a frame synchronization (frame-sync) error memory of FIG. 3.

FIG. 5 is a view showing the structure of the frame-sync error memory 130. Referring to FIG. 5, the frame-sync error memory 130 has first through N-th frame-sync error memories each having the size of 1×496 bits and being capable of storing information of 496 bits indicating an error existence/absence for each of the 496 sync data included in one data block. Accordingly, frame-sync error information for one data block is stored in a frame-sync error memory with the size of 1×496 bits. N frame-sync error memories each having the size of 1×496 bits are provided to store frame-sync error information of N data blocks, considering the timing between the generation of a BIS error flag by the error correction code decoder 140 and the storage of the BIS error flag by the BIS error flag memory 160. According to an embodiment of the present invention, N is three.

The error correction code decoder 140 performs error-correction for BIS of the data block stored in the memory 120. Then, the error-correction code decoder 140 outputs a BIS error flag as information indicating an error existence/absence for each symbol of BIS to the error flag generator 150. The error flag generator 150 outputs the BIS error flag to the BIS error flag memory 160.

Thereafter, the error correction code decoder 140 receives an error flag generated by the error flag generator 150 and performs erasure correction for the symbol signal stored in the memory 120 for each data block.

The error flag generator 150 generates an error flag for erasure correction using the frame-sync error information stored in the frame-sync error memory 130 and the BIS error flag stored in the BIS error flag memory 160, and outputs the error flag to the error correction code decoder 140.

Referring to FIG. 2, the error flag generation operation of the error flag generator 150 will be described in detail. As shown in FIG. 2, one data frame includes four ECC data, each being 38 bytes wherein each ECC data is located between frame-sync data and BIS data or between BIS data and BIS data.

If both frame-sync error information and a BIS error flag of the frame-sync data and the BIS data which are neighboring a corresponding 38-byte ECC data, or both BIS error flags of BIS data which are neighboring a corresponding 38-byte ECC data indicate error existence, the error flag generator 150 generates an error flag requiring erasure correction for the corresponding 38-byte ECC data, with reference to error information stored in the frame-sync error memory 130 and the BIS error flag memory 160.

The BIS error flag memory 160 receives the BIS error flag generated by the error correction decoder 140 via the error flag generator 150 and stores the received BIS error flag.

Figure 6:
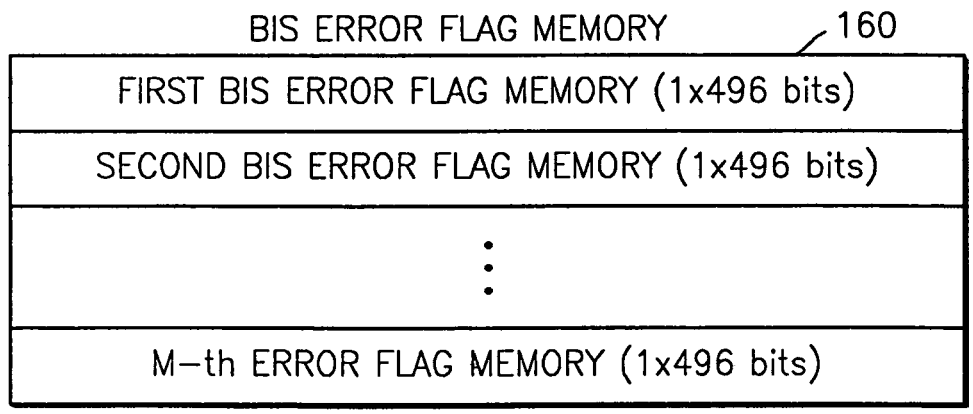
FIG. 6 is a view showing a structure of a BIS (Burst Indicator Subcode) error flag memory of FIG. 3.

FIG. 6 is a view showing the structure of the BIS error flag memory 160. Referring to FIG. 6, one data block includes three BIS columns, with each BIS being 1 byte wherein each BIS column has 496 rows. Therefore, the BIS error flag memory 160 has first and M-th BIS error memories each being 1×496 bits and being capable of storing information of 496 bits indicating an error existence/absence for each BIS data included in one data block. According to an embodiment of the prevent invention, M is three.

Hereinafter, an error flag generation method according to the present invention will be described in detail.

Figure 7:
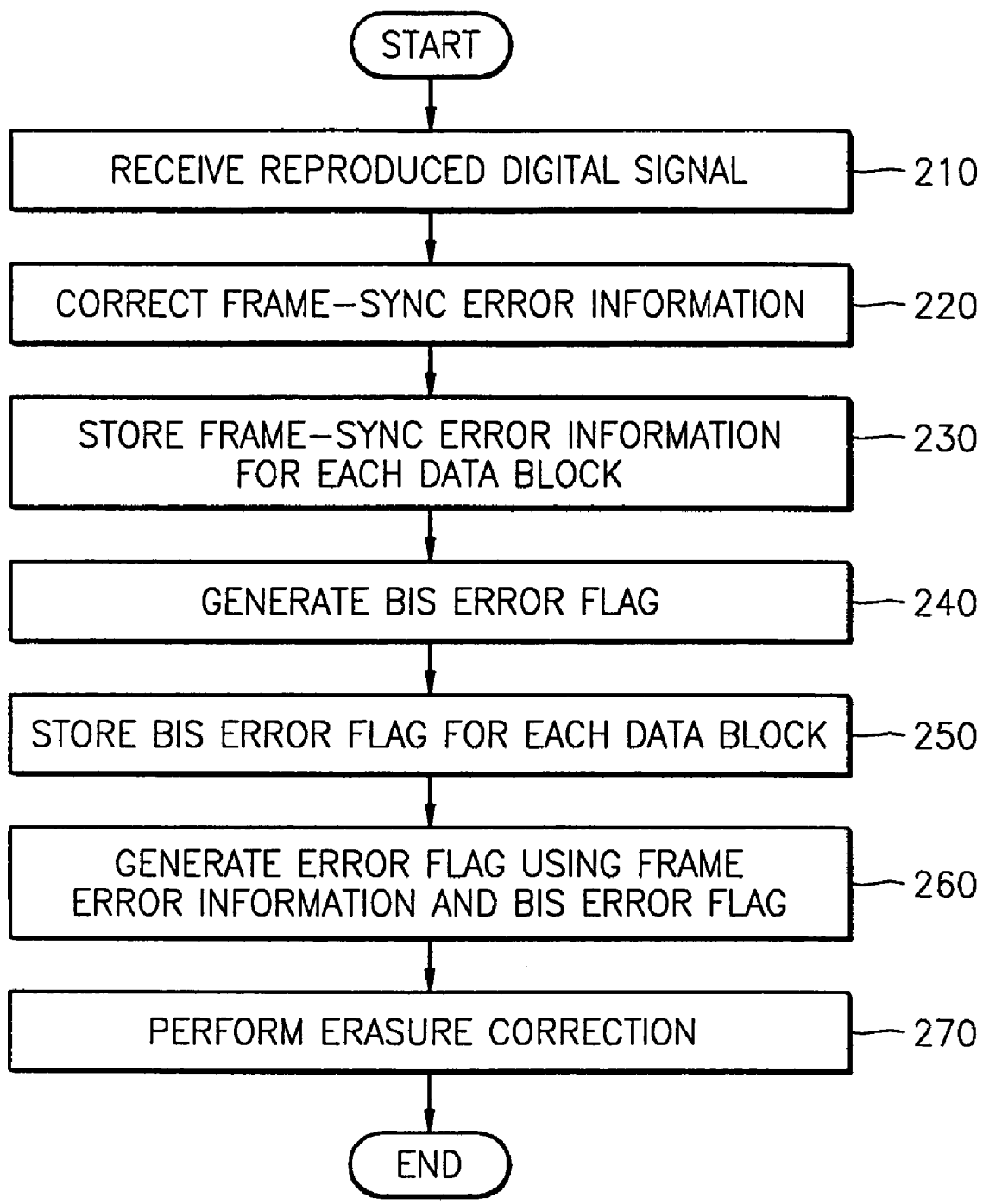
FIG. 7 is a flowchart illustrating a method for generating an error flag, according to an embodiment of the present invention.

FIG. 7 is a flowchart illustrating an error flag generation method according to an embodiment of the present invention.

The frame-sync detector 110 receives a reproduced digital signal for each data block (operation 210).

The frame-sync detector 110 generates frame-sync error information indicating an error existence/absence for the frame-sync data of each of the frames having a data block, and outputs the frame-sync error information to the frame-sync error memory 130 (operation 220). Also, the frame-sync detector 110 outputs a digital signal for error correction to the memory 120 for each data block.

The frame-sync error memory 130 receives the frame-sync error information corresponding to one data block from the frame-sync detector 110 and stores the received frame-sync error information (operation 230).

The frame-sync error memory 130 has first through N-th frame-sync error memories each being the size of 1×496 bits and being capable of storing information of 496 bits indicating an error existence/absence for the 496 sync data included in one data block. According to an embodiment of the present invention, N is three. Meanwhile, N frame-sync error memories each having the size of 1×496 bits are provided to store the frame-sync error information of three data blocks, considering the timing between the generation of the BIS error flag by the error correction code decoder 140 and the storage of the BIS error flag by the BIS error flag memory 160.

The error correction code decoder 140 performs error-correction for BIS of the data block stored in the memory 120 and generates a BIS error flag as information indicating error existence/absence for each symbol of BIS (operation 240).

The error correction code decoder 140 outputs the generated BIS error flag to the error flag generator 150. The error flag generator 150 outputs the BIS error flag to the BIS error flag memory 160 and the BIS error flag memory 160 stores the BIS error flag (operation 250). The BIS error flag memory 160 has first through M-th BIS error memories each being the size of 1×496 bits and being capable of storing information of 496 bits, in order to indicate an error existence/absence for each BIS data included in one data block. According to an embodiment of the present invention, M is three.

The error flag generator 150 generates an error flag for erasure correction using the frame-sync error information stored in the frame-sync error memory 130 and the BIS error flag stored in the BIS error flag memory 160 (operation 260).

The error flag generator 150 generates an error flag requiring erasure correction of corresponding 38-byte ECC data, with reference to error information stored in the frame-sync error memory 130 and the BIS error flag memory 160, if both frame-sync error information of frame-sync data and a BIS error flag of BIS data which are neighboring a corresponding 38-byte ECC data, or both BIS error flags of BIS data which are neighboring a corresponding 38-byte ECC data indicate error existence.

The error correction code decoder 140 receives the error flag generated by the error flag generator 150 and performs erasure correction of the symbol signal stored in the memory 120 for each data block (operation 270).

As described above, the error flag generation apparatus and method for error correction, according to the present invention, can be easily implemented with improved error-correction performance and be advantageous in cost.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus generating error flags for a data frame including a plurality of ECC (Error-Correction Coding) data blocks, wherein each ECC data block is located between frame-sync data and BIS (Burst Indicator Subcode) data or between two of the BIS data, the BIS data comprising information that is inserted in order to indicate a generation of a burst error, the apparatus comprising:

a frame-sync error memory which stores frame-sync error information for at least one of the ECC data blocks;

a BIS error flag memory which stores a BIS error flag for the at least one ECC data block; and an error flag generator, which generates one of the error flaps indicating an error existence/absence for a corresponding one of the ECC data blocks with reference to the frame-sync error information stored in the frame-sync error memory and the BIS error flag stored in the BIS error flag memory, wherein the at least one ECC data block has an error correction format in which the frame-sync data is recorded in a heading of the at least one ECC data block and BIS data columns are recorded between sets of ECC data columns, and the error flag generator generates an error flag indicating an error existence for an entire ECC data constructing a set of ECC data columns with reference to error information stored in the frame-sync error memory and the BIS error flag memory, if both the frame-sync error information of the frame-sync data and the BIS error flag of one of the BIS data columns neighboring the set of the ECC data columns, or the BIS error flag of the BIS data columns neighboring the set of the ECC data columns, indicate the error existence.

2. An apparatus generating error flags for a data frame including a plurality of ECC (Error-Correction Coding) data blocks, wherein each ECC data block is located between frame-sync data and BIS (Burst Indicator Subcode) data or between two of the BIS data, the BIS data comprising information that is inserted in order to indicate a generation of a burst error, the apparatus comprising:

a frame-sync error memory which stores frame-sync error information for at least one of the ECC data blocks;

a BIS error flag memory which stores a BIS error flag for the at least one ECC data block;

an error flag generator, which generates one of the error flags indicating an error existence/absence for a corresponding one of the ECC data blocks with reference to the frame-sync error information stored in the frame-sync error memory and the BIS error flag stored in the BIS error flag memory; and a frame-sync detector, which receives a reproduced digital signal for the at least one ECC data block, determines the error existence/absence for frame-sync data for the at least one ECC data block, and outputs frame-sync error information to the frame-sync error memory.

3. An error flag generation method comprising:

receiving a reproduced digital signal;

generating frame-sync error information for at least one Error Correction Coding (ECC) data block located between frame-sync data and BIS (Burst Indicator Subcode) data or between two of the BIS data, the BIS data comprising information that is inserted in order to indicate a generation of a burst error, using the reproduced digital signal;

storing the frame-sync error information in a frame-sync error memory for the at least one ECC data block;

generating a BIS error flag for the at least one ECC data block;

storing the BIS error flag in a BIS error flag memory for the at least one ECC data block; and generating error flags indicating error existence/absence for a corresponding ECC data block with reference to the frame-sync error information stored in the frame-sync error memory and the BIS error flag stored in the BIS error flag memory, wherein the at least one ECC data block has an error correction format in which the frame-sync data is recorded in a heading of the at least one ECC data block and BIS data columns are recorded respectively between sets of ECC data columns, and the generating of the error flag comprises generating an error flag indicating the error existence for an entire ECC data constructing a set of ECC data columns, with reference to error information stored in the frame-sync error memory and the BIS error flag memory, if both the frame-sync error information of the frame-sync data and the BIS error flag of a BIS data column neighboring the set of the ECC data columns, or the BIS error flag of the BIS data columns neighboring the set of the ECC data columns, indicate error existence.

4. An apparatus generating error flags for a data frame including a plurality of ECC (Error-Correction Coding) data blocks, wherein each ECC data block is located between frame-sync data and BIS (Burst Indicator Subcode) data or between two of the BIS data, the BIS data comprising information that is inserted in order to indicate a generation of a burst error, comprising:

a frame-sync detector, outputting frame-sync error information indicating an existence/absence of an error for frame sync-data of frames forming the ECC data blocks;

a frame-sync error memory, storing the frame-sync error information of the frames forming the ECC data blocks;
a BIS (Burst Indicator Subcode) error flag memory, storing a BIS error flag for the ECC data blocks; and
an error flag generator, generating one of the error flags indicating an existence/absence of an error for a corresponding one of the ECC data blocks with reference to the frame-sync error information stored in the frame-sync error memory and the BIS error flag stored in the BIS error flag memory,
wherein each of the ECC data blocks has an error correction format in which frame-sync data is recorded in a heading of the ECC data block and BIS data columns are recorded between sets of ECC data columns, and the error flag generator generates an error flag indicating the existence of an error for an entire ECC data forming one of the sets of ECC data columns with reference to error information stored in the frame-sync error memory and the BIS error flag memory, if the frame-sync error information of the frame-sync data and the BIS error flag of the BIS data column neighboring the set of the ECC data columns, or the BIS error flag of the BIS data columns neighboring the set of the ECC data columns, indicate error existence.

* * * * *